(12) United States Patent
Dubhashi

(10) Patent No.: US 6,744,136 B2
(45) Date of Patent: Jun. 1, 2004

(54) SEALED LIQUID COOLED ELECTRONIC DEVICE

(75) Inventor: Ajit Dubhashi, Redondo Beach, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 10/283,414

(22) Filed: Oct. 29, 2002

(65) Prior Publication Data

US 2003/0080413 A1 May 1, 2003

Related U.S. Application Data

(60) Provisional application No. 60/340,821, filed on Oct. 29, 2001.

(51) Int. Cl.[7] .......................... H01K 7/20; H01L 39/02
(52) U.S. Cl. ............. 257/714; 257/715; 257/716; 257/717; 257/676; 257/723; 257/686; 257/685; 257/687; 361/385
(58) Field of Search ................... 257/712–717, 257/721, 686, 685, 723, 777, 687; 361/385

(56) References Cited

U.S. PATENT DOCUMENTS

| | | | |
|---|---|---|---|
| 3,741,292 A | 6/1973 | Aakalu et al. | 165/105 |
| 4,050,507 A | 9/1977 | Chu et al. | 165/1 |
| 4,312,012 A | 1/1982 | Frieser et al. | 357/82 |
| 4,715,189 A | 12/1987 | Hohenwarter | 62/64 |
| 4,734,820 A | * 3/1988 | Lauffer et al. | 361/700 |
| 4,980,754 A | * 12/1990 | Kotani et al. | 257/716 |
| 5,323,292 A | * 6/1994 | Brzezinski | 361/689 |
| 5,343,360 A | * 8/1994 | Sanwo | 361/707 |

FOREIGN PATENT DOCUMENTS

| | | | |
|---|---|---|---|
| JP | 61-18162 | * 1/1986 | 257/714 |
| JP | 62-295441 | * 12/1987 | |
| JP | 2-291157 | * 11/1990 | 257/714 |

* cited by examiner

*Primary Examiner*—Alexander Oscar Williams
(74) *Attorney, Agent, or Firm*—Ostrolenk, Faber, Gerb & Soffen, LLP

(57) ABSTRACT

A liquid cooled electronic device and a method for sealing a liquid cooled electronic device are disclosed. The liquid cooled electronic device has at least one heat generating electronic device suspended in an electrically insulative heat transfer fluid. The heat generating device or devices are electrically connected to at least two electrodes, which pass through and are sealed in electrically insulating portion of a sealed housing that encloses the electrically insulative heat transfer fluid. At least one thermally conductive surface is in direct contact with the electrically insulative heat transfer fluid, and at least one thermally conductive surface is sealed to the remainder of the housing, for example.

28 Claims, 3 Drawing Sheets

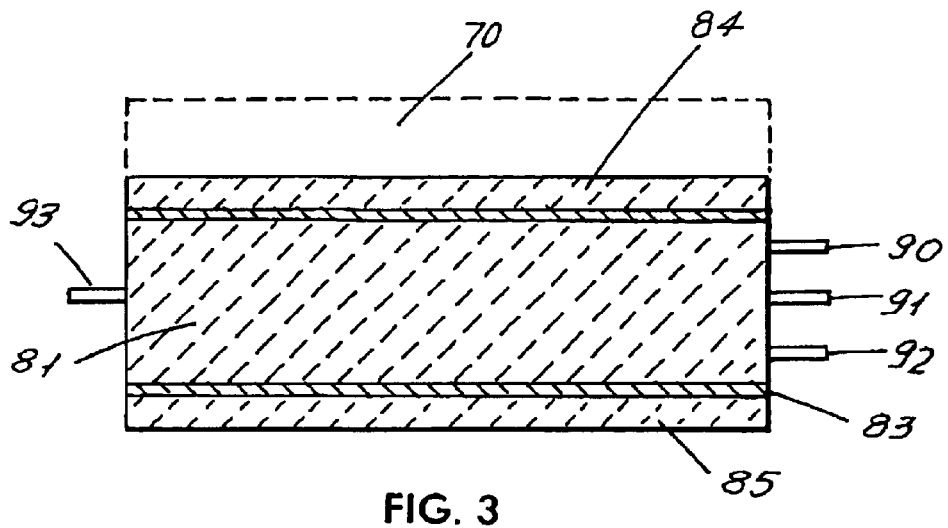
FIG. 3
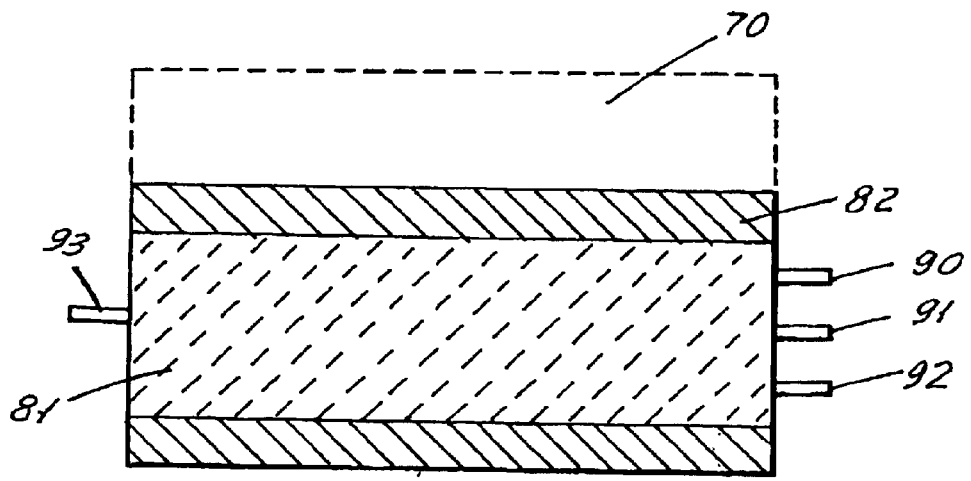
FIG. 4
$$CF_3 \, [(O\text{-}CF\text{-}CF_2)_M - (O\text{-}CF_2)_N] \, O\text{-}CF_3$$
$$\vert$$
$$CF_3$$
FIG. 7

US 6,744,136 B2

SEALED LIQUID COOLED ELECTRONIC DEVICE

RELATED APPLICATION

This application claims the benefit of U.S. Provisional Application No. 60/340,821, filed Oct. 29, 2001.

FIELD OF THE INVENTION

This invention relates to electronic devices and more specifically relates to a package for electronic devices having improved cooling.

BACKGROUND OF THE INVENTION

Semiconductor die such as diodes, transistors, thyristors and the like are usually mounted within a protective housing, frequently a plastic molded structured which encloses the die. The protective packages are made of electrical insulation materials which reduce the ability to remove heat generated by the die over its full surface area and from localized hot spots on the die.

It would be desirable to provide a semiconductor device package which provides excellent electrical insulation properties for the die while providing improved cooling of the die and reducing hot spot heating on the die.

SUMMARY OF THE INVENTION

In accordance with the present invention a heat-generating electronic device is suspended in an electrically insulative heat transfer fluid, which is sealed in a housing. The lead frame terminals are sealed in and passed through the housing wall for external connection. At least a portion of the housing is thermally conductive and in direct contact with the electrically insulative heat transfer fluid, which is sealed in the interior volume within the housing. An insulative heat transfer fluid such as any of the well known liquids, for example, GALDEN® PFPE$^{0001}$, a perfluoropolyether, which has the chemical formula shown in FIG. 7, then fills at least a portion of the interior of the housing and is in contact with an exposed surface of one or more of the die of the heat generating electronic device. Thus heat produced by the device is carried by conduction and convection through the fluid (preferably a liquid) to the thermally conductive plate or plates, and then to the ambient exterior of the package.

Herein the term thermally conductive is defined as having a coefficient of thermal conductivity of at least 170 W/m K, the thermoconductivity of aluminum nitride. Some other examples of thermally conductive materials are aluminum and alloys of aluminum that are thermally conductive (about 200 W/m K), beryllium oxide (260 W/m K), and copper (393 W/m K), for example.

BRIEF DESCRIPTION OF THE DRAWINGS

FIG. 3 shows a side view of another embodiment of the housing.

FIG. 4 shows a side view of another embodiment of the housing.

FIG. 7 shows the chemical formula of perfluoropolyether.

DETAILED DESCRIPTION OF THE PREFERRED EMBODIMENTS

Figure 1:
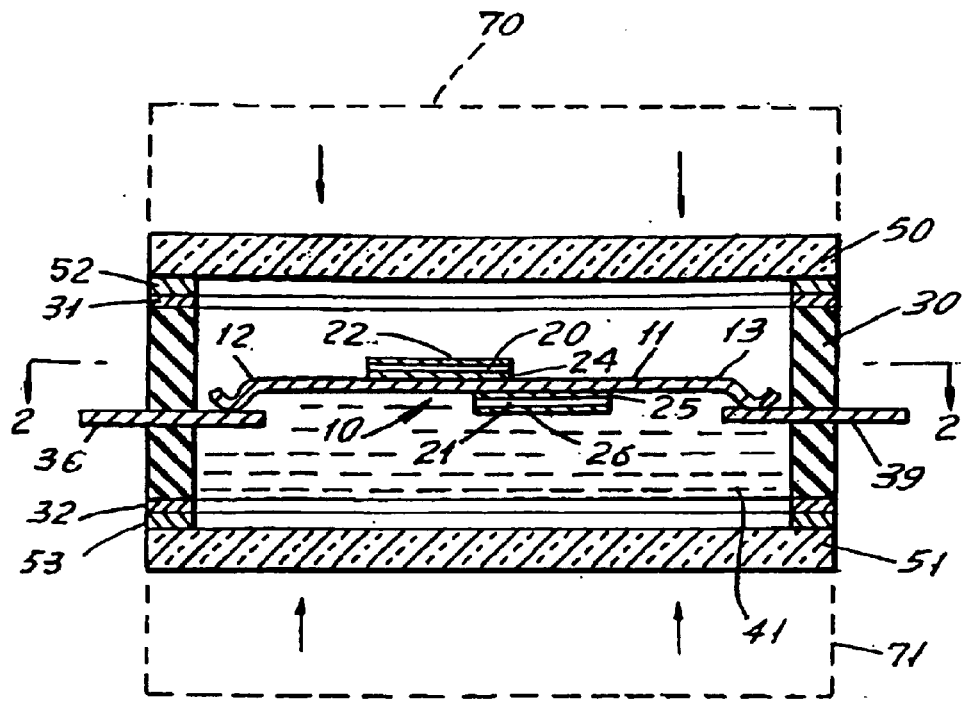
FIG. 1 shows a cross-section of the package of one embodiment of the invention, taken across section line 1—1 in FIG. 2.
Figure 2:
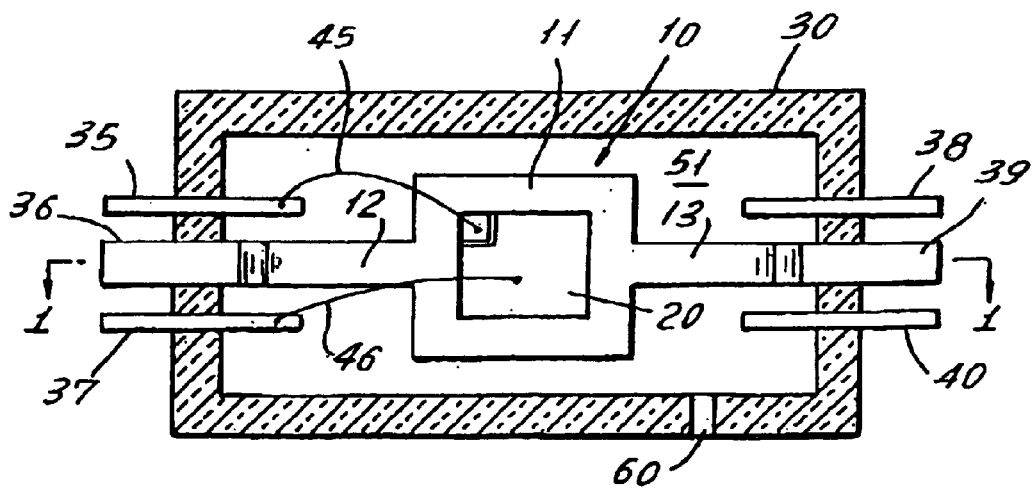
FIG. 2 is a cross-section of FIG. 1 taken across section line 2—2 in FIG. 1.

FIGS. 1 and 2 show a thin conductive lead frame 10 which has a paddle section 11 and leads 12 and 13 which extend integrally from paddle 11. Other lead patterns could be used.

Semiconductor die 20, which may be a power MOSFET has its bottom mount electrode 24 electrically connected to the top of paddle 11, for example, by soldering. A second die 21 may be fixed on the same side of paddle 11, or, as shown, on the bottom side of paddle 11.

A closed insulation housing wall 30 of any desired shape and material is then prepared and has through conductors 35, 36, 37, 38, 39 and 40 sealed therein. The top and bottom surfaces of ring 30 may be metallized by metallizing rings 31 and 32 which are spaced planar parallel rings. Note that only the top of housing 30 need be open, with the ring having the shape of a cup with a closed bottom.

The lead frame 10 may then be mounted by soldering or otherwise fixing the outer ends of terminals 12 and 13 to the interiorly projecting contacts 36 and 39 respectively thus suspending the lead frame and die within the volume 41 within ring 30. For example, a gate electrode and source electrode of die 10 are then wire bonded to the interior projections of terminals 35 and 37, respectively, by wire bonds 45 and 46, respectively. Similar connections will be made for die 21 to terminals 38 and 40, for example.

Thermally conductive, but electrically insulative plates 50 and 51, which may have metallized annular rings 52 and 53, respectively, are fixed to, and are sealed to, for example, by welding or brazing or by epoxy adhesive, to rings 31 and 32 respectively. Alternatively, thermally conductive plates 50 and 51 may be electrically conductive, for example, aluminum, and may be bonded directly to rings 31 and 32, respectively.

The interior of volume 41 and the full volume surrounding lead frame 10 is then sealed, and is filled with a suitable electrically insulative heat transfer fluid, preferably a liquid such as a perfluoropolyether, e.g., GALDEN® PFPE with a high temperature boiling point that is greater than the operational temperature of the heat-generating electronic device. The liquid can be loaded into the sealed volume 41, as through a filling tube 60 (FIG. 2) which can be clamped or sealed closed after filling.

In operation, the heat generated by die 20 and 21 will be coupled directly to the liquid in volume 41 to the thermally conducive plates 50 and 51, which may be, for example, beryllium oxide ceramics or the like. The liquid will circulate by natural convection to conduct heat away from hot spots and from the whole exposed area of die 20 and 21 and lead frame 10 and into heat exchange contact with the interior surfaces of plates 50 and 51. The heat may be removed from the outer surfaces of plates 50 and 51 by convection to the ambient. Alternatively, desired, massive copper conductive plates 70 and 71 can be pressed into contact with plates 50 and 51. In another alternative embodiment passive or active heat sinks may be mounted to plates 50 and 51.

FIG. 4 shows another embodiment of the present invention having a heat generating device suspended in a heat transfer fluid that is an electrically insulative liquid which is sealed in the housing shown in the figure. The housing has a top plate 84, a bottom plate 85 and a central housing wall 81. Also, a plurality of through conductors 90, 91, 92, 93 extends through the central housing wall 81. The through conductors 90, 91, 92, 93 are electrically conductive and are sealed within the central housing wall 81. For example, the top and bottom plate are sealed to the central housing wall by a sealing means 83, which can be a metallic seal, a compression seal or an adhesive, for example. In one embodiment, the sealing means 83 comprises the same structure as shown in FIG. 1, which uses, for example, metallized annular ring 52 and 53 and rings 31 and 32. In this case, sealing means 83 represents the result of the sealed metallized ring 53 and ring 32, for example by fusing the two rings. In FIG. 3, the material used for the top plate 84, the bottom plate 85 and the central housing wall 81 is the same material, which is both electrically insulative and thermally conductive. FIG. 4 shows another embodiment of the present invention, which uses a different material for the top plate 82 and the central housing unit 81. For example, the top plate 82 is an electrically and thermally conductive material, and the central housing wall 81 is an electrically insulating but thermally conductive material. In an alternative embodiment, the central housing wall 81 may be selected as an electrically insulative and thermally insulative material. In this alternative embodiment, heat extraction primarily occurs through the thermally conductive plates. For example, both the top plate and bottom plate are thermally conductive. In yet another embodiment, the thermally conductive top plate 82 can be electrically conductive. For example, the material of the top plate 82 may be an aluminum alloy, pure aluminum, beryllium oxide, or aluminum nitride.

Figure 5:
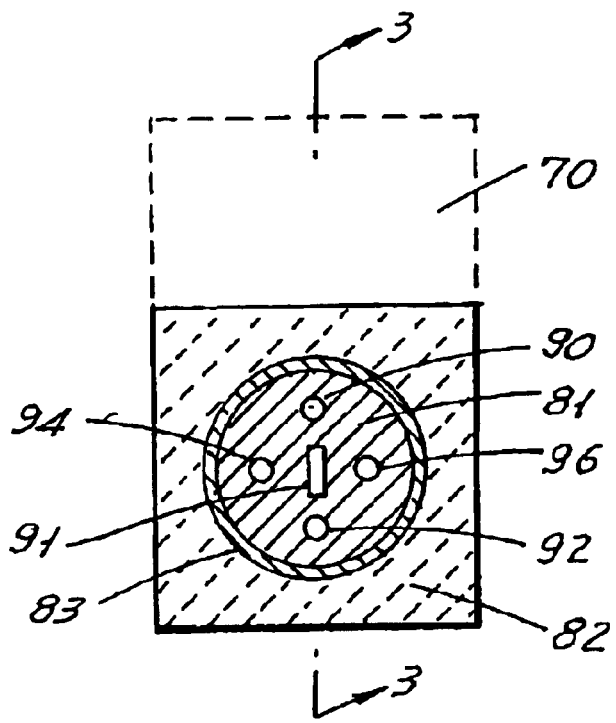
FIG. 5 shows an end view of yet another embodiment of the housing.

FIG. 5 shows an end of yet another embodiment of the present invention. In this embodiment, the housing comprises a sealed enclosure having an electrically insulative portion 81 and a thermally conductive portion 82, wherein the electrically insulative portion is sealed in the thermally conductive portion. A plurality of electrically conductive through conductors 90, 91, 92 and 94 extend through the electrically insulative portion and are sealed therein.

Figure 6:
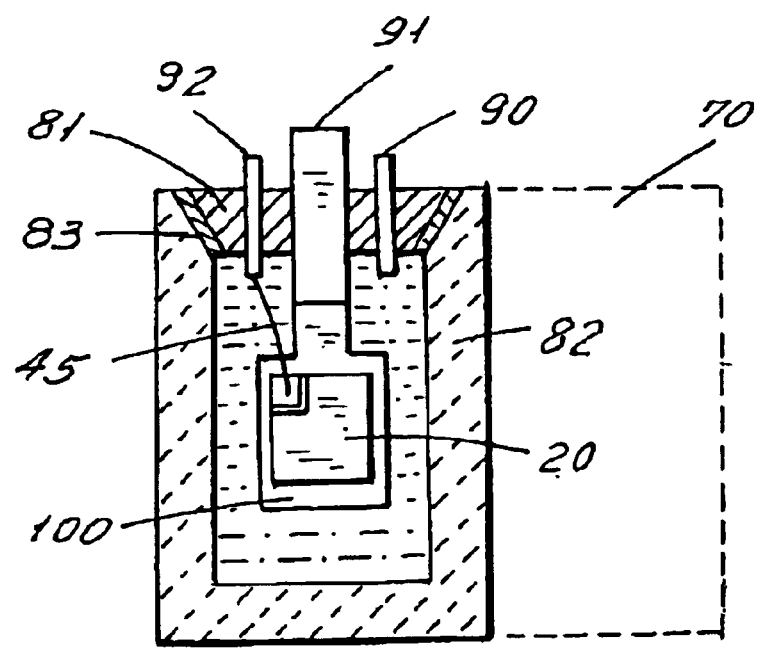
FIG. 6 shows a cross section along the plane into the page shown as line 3 on FIG. 5 of one embodiment.

FIG. 6 shows a cross-section taken along the plane indicated by line 3, which extends into the page. FIG. 6 shows a heat generating electronic device suspended in the heat transfer fluid which fills the sealed enclosure. The electrically insulative portion 81 is sealed to the thermally conductive portion 82 by the sealing means 83. The heat generating device has a plurality of electrodes, for example, a source, a gate and a drain. In another example, the drain electrode may be a bottom mount electrode, which is located on the bottom of the heat generating device. FIG. 6 shows one of the electrodes wire bonded to a through conductor 92. Another of the electrodes of the heat generating device of FIG. 6 is surface mounted to the pad of the suspension structure 100, for example. In this example, the suspension structure 100 is physically and electrically attached to through conductor 91. In another embodiment, a second heat generating device having a plurality of electrodes is attached on the opposite side of the suspension device 100. The electrodes of the second device may be attached to one or more of the plurality of through conductors or to one or more of the electrodes of the first device. Also, an electrode can be electrically connected to the suspension structure 100.

The distance between the housing and the suspended heat generating electronic devices may be selected such that the heat transfer fluid is capable of convectively displacing around the heat generating electronic devices. Thereby, the heat transfer fluid that is heated by the heat generating devices can readily flow around the heat generating devices, removing heat and carrying it to the thermally conductive portion of the housing.

Optionally, a heat sink 70 may be in contact with the thermally conductive portion of the housing, efficiently removing heat from the sealed liquid cooled electronic device. In one alternative embodiment of FIG. 6, the material for the thermally conductive portion 82 and the electrically insulative portion 81 may be the same material. In this case, the sealed enclosure is thermally conductive and electrically insulative, with possible exception for the sealing means 83. This alternative embodiment is advantageous, because heated liquid is convectively displaced under the influence of gravity, and the convectively displaced heated liquid encounters a thermally conductive surface in the alternative embodiment, regardless of the orientation of the sealed liquid cooled electronic device. However, if the thermally conductive material is electrically conductive, such as aluminum, then the electrically insulative material must be a different material from the thermally conductive material.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. A sealed liquid cooled electronic device comprising:
a heat-generating electronic device;
a heat transfer fluid wherein the heat transfer fluid is an electrically insulative liquid;
a housing, wherein the heat-generating electronic device is suspended in the heat transfer fluid and wherein the heat transfer fluid is sealed within the housing, and wherein the housing comprises a sealed enclosure having a plurality of through conductors, a thermally conductive portion of the sealed enclosure, and an electrically insulative portion of the sealed enclosure, wherein the plurality of through conductors extend through the electrically insulative portion of the sealed enclosure, and wherein the heat-generating electronic device has a plurality of electrodes and one of the plurality of electrodes is electrically connected to one of the plurality of through conductors and another of the plurality of electrodes is electrically connected to another of the plurality of through conductors; and
wherein the heat transfer fluid is in direct contact with at least a portion of the thermally conductive portion of the sealed enclosure.

2. The sealed liquid cooled electronic device of claim 1, wherein the sealed enclosure provides sufficient distance between the housing and the suspended heat-generating electronic device such that the heat transfer fluid is capable of convectively displacing around the heat-generating electronic device, whereby all sides of the heat-generating electronic device are cooled by the convectively displacing heat transfer fluid.

3. The sealed liquid cooled electronic device of claim 1, wherein the thermally conductive portion of the sealed enclosure and the electrically insulative portion of the sealed enclosure are made of the same material.

4. The sealed liquid cooled electronic device of claim 3, wherein the sealed enclosure is entirely thermally conductive.

5. The sealed liquid cooled electronic device of claim 1, wherein the thermally conductive portion has a thermal conductivity of at least 200 W/mK.

6. The sealed liquid cooled electronic device of claim 1, further comprising:
a second heat-generating device having a plurality of electrodes, wherein at least one of the plurality of electrodes of the second heat-generating device electrically attaches to at least one of the through conductors.

7. The sealed liquid cooled electronic device of claim 1, wherein the electrically insulative portion of the sealed enclosure comprises a central housing wall having an open top and an open bottom, and wherein the thermally conductive portion of the sealed enclosure comprises a top plate and a bottom plate, wherein the top plate is sealed to the open top and the bottom plate is sealed to the open bottom, whereby the housing is sealed.

8. A liquid cooled electronic device for at least one semiconductor device having a plurality of electrodes, the liquid cooled electronic device comprising:
a housing having a first interiorly projecting contact, a second interiorly projecting contact, and a plurality of sealed electrical conductors extending through the housing, wherein at least one of the plurality of electrodes of at least one semiconductor device makes an electrical connection with at least one of the plurality of electrical conductors, and wherein the housing is electrically insulative;
an electrically conductive lead frame comprising a first lead, a second lead and a paddle section, wherein the paddle section has a top surface and a bottom surface, and wherein the first lead and the second lead extend from the paddle section and are in electrical contact with the paddle section and wherein the first lead is attached to the first interiorly projecting contact and the second lead is attached to the second interiorly projecting contact, and wherein the at least one semiconductor device is attached to the paddle section;
a top conductive plate, wherein the top conductive plate is thermally conductive, and wherein the top conductive plate is sealed to a top surface of the liquid immersion housing;
an electrically insulative heat transfer fluid, wherein the electrically insulative heat transfer fluid is sealed within a volume defined by the housing and the top conductive plate, and wherein the electrically insulative heat transfer fluid is in direct contact with the semiconductor device, wherein the electrically insulative heat transfer fluid conducts and convects heat from the semiconductor device to the top conductive plate.

9. The liquid cooled electronic device of claim 8, wherein the top conductive plate is sealed to the top surface of the housing by affixing the top conductive plate to a metallized annular ring.

10. The liquid cooled electronic device of claim 9, wherein the metallized annular ring is sealed to a spaced planar parallel metallizing ring that is bonded to the top surface of the housing.

11. The liquid cooled electronic device of claim 10, wherein the metallized annular ring is fused to a spaced planar parallel metallizing ring that is bonded to the top surface of the housing.

12. The liquid cooled electronic device of claim 10, wherein the top conductive plate is a beryllium oxide ceramic.

13. The liquid cooled electronic device of claim 8, wherein the insulative heat transfer fluid is introduced through a filling tube that is sealed after filling the volume defined by the housing and the top conductive plate.

14. The liquid cooled electronic device of claim 8, wherein the top conductive plate is in compressive contact with a copper conductive plate.

15. A liquid cooled electronic device for a plurality of semiconductor devices each having a plurality of electrodes, the liquid immersion cooling device comprising:
a housing wall, the housing wall comprising
a top surface,
a bottom surface,
a plurality of sealed electrical conductors extending through the housing wall, wherein at least one of the plurality of electrodes of the plurality of semiconductor devices makes an electrical connection with at least one of the plurality of electrical conductors;
a first interiorly projecting contact and a second interiorly projecting contact; wherein the first interiorly projecting contact and the second interiorly projecting contact extend through and are sealed in the housing wall;
an electrically conductive lead frame comprising a first lead, a second lead and a paddle section, wherein the paddle section has a top surface and a bottom surface, and wherein the first lead and the second lead extend from the paddle section and are in electrical contact with the paddle section and wherein the first lead is physically supported by the first interiorly projecting contact and is electrical connected therewith and the second lead is physically supported by the second interiorly projecting contact and is electrical connected therewith, and wherein each of the plurality of semiconductor devices are attached to one of the top surface or the bottom surface of the paddle section and wherein one of the plurality of electrodes is located on a bottom surface of each of the plurality of semiconductor devices and is electrically connected to one of the top surfaces or the bottom surface of the paddle section
a first conductive plate and a second conductive plate, wherein the first conductive plate and the second conductive plate are thermally conductive, and wherein the first conductive plate is sealed to the top surface of the liquid immersion housing and the second conductive plate is sealed to the bottom surface of the liquid immersion housing;
an electrically insulative heat transfer fluid, wherein the electrically insulative heat transfer fluid is sealed within a volume defined by the housing wall, the first conductive plate and the second conductive plate, and wherein the electrically insulative heat transfer fluid is in direct contact with the plurality of semiconductor devices and at least one of the first conductive plate or the second conductive plate, wherein the electrically insulative heat transfer fluid conducts and convects heat away from the plurality of semiconductor devices.

16. The liquid cooled electronic device of claim 15, wherein at least one of the first conductive plate or the second conductive plate is sealed to the housing wall by affixing the at least one of the first conductive plate or the second conductive plate to a metallized annular ring.

17. The liquid immersion cooling device of claim 16, wherein the metallized annular ring is sealed to a spaced planar parallel metallizing ring that is bonded to the housing wall.

18. The liquid cooled electronic device of claim 16, wherein the metallized annular ring is fused to a spaced planar parallel metallizing ring that is bonded to the housing wall.

19. The liquid cooled electronic device of claim 16, wherein at least one of the first conductive plate or the second conductive plate is a beryllium oxide ceramic.

20. The liquid cooled electronic device of claim 15, wherein the insulative heat transfer fluid is introduced through a filling tube that is sealed after filling the volume defined by the housing wall, the first conductive plate and the second conductive plate.

21. The liquid cooled electronic device of claim 15, wherein at least one of the top conductive plate or the bottom conductive plate is in compressive contact with a copper conductive plate.

22. A liquid cooled electronic device comprising:
- a power MOSFET having a bottom drain contact, a gate electrode and a source electrode;
- a housing having a plurality of through conductors sealed within and extending through the housing, and a first interiorly projecting contact and a second interiorly projecting contact, wherein the housing is electrically insulative;
- an electrically conductive lead frame comprising a first lead, a second lead and a paddle section, and wherein the first lead and the second lead extend from the paddle section and are in electrical contact with the paddle section and wherein the first lead is attached to the first interiorly projecting contact and the second lead is attached to the second interiorly projecting contact, and wherein the power MOSFET is attached to the paddle section and the bottom drain contact of the power MOSFET is electrically connected to the paddle section;
- a plurality of wire bonds, wherein the gate electrode is electrically connected by one of the plurality of wire bonds to one of the plurality of through conductors, and wherein source electrode is electrically connected by another of the plurality of wire bonds to another of the plurality of through conductors;
- a top conductive plate, wherein the top conductive plate is thermally conductive, and wherein the top conductive plate is sealed to the top of the housing;
- an electrically insulative heat transfer fluid, wherein the electrically insulative heat transfer fluid is sealed within a volume defined by the housing and the top conductive plate, and wherein the electrically insulative heat transfer fluid is in direct contact with the power MOSFET and the top conductive plate, wherein the electrically insulative heat transfer fluid conducts and convects heat from the semiconductor device to the top conductive plate.

23. The liquid cooled electronic device of claim 22, further comprising a second power MOSFET having a bottom drain contact wherein the second power MOSFET is attached to the paddle section and the bottom drain contact is electrically connected to the paddle section.

24. The liquid cooled electronic device of claim 23, wherein the paddle section comprises:
- a top surface; and
- a bottom surface,
- and wherein the first power MOSFET is attached to the top surface and the second power MOSFET is attached to the bottom surface.

25. The liquid cooled electronic cooling device of claim 22, wherein the top conductive plate is a beryllium oxide ceramic.

26. The liquid cooled electronic device of claim 8, wherein one of the plurality of electrodes is a bottom mount electrode located on a bottom surface of the semiconductor device, and wherein the bottom mount electrode is electrically connected to the paddle section.

27. The liquid cooled electronic device of claim 26, wherein the top conductive plate is electrically insulative and the thermal conductivity is at least 200 W/mK.

28. The liquid cooled electronic device of claim 15, wherein the first conductive plate and the second conductive plate are electrically insulative and the thermal conductivity is at least 200 W/mK.

* * * * *